United States Patent

Haehn et al.

[11] Patent Number: 6,091,652
[45] Date of Patent: Jul. 18, 2000

[54] TESTING SEMICONDUCTOR DEVICES FOR DATA RETENTION

[75] Inventors: Steven L. Haehn; James P. Yakura, both of Colorado Springs, Colo.

[73] Assignee: LSI Logic Corporation, Milpitas, Calif.

[21] Appl. No.: 09/209,907

[22] Filed: Dec. 11, 1998

[51] Int. Cl.[7] .................................................. G11C 7/00
[52] U.S. Cl. ...................... 365/201; 365/218; 365/185.29
[58] Field of Search .................................. 365/201, 218, 365/185.29, 185.09, 185.32, 200; 371/21

[56] References Cited

U.S. PATENT DOCUMENTS

| | | | |
|---|---|---|---|
| 4,243,937 | 1/1981 | Multani et al. | 324/158 T |
| 4,862,418 | 8/1989 | Cuppens et al. | 365/201 |
| 4,888,735 | 12/1989 | Lee et al. | 365/185.33 X |
| 5,070,378 | 12/1991 | Yamagata | 357/23.5 |
| 5,359,205 | 10/1994 | Ovshinsky | 257/3 |
| 5,590,075 | 12/1996 | Mazzali | 365/185.22 |
| 5,604,699 | 2/1997 | Cappelletti et al. | 365/201 X |
| 5,656,521 | 8/1997 | Hamilton et al. | 365/185.32 X |
| 5,673,228 | 9/1997 | Timm et al. | 365/201 |
| 5,953,255 | 9/1999 | Lee | 365/185.29 |

OTHER PUBLICATIONS

IBM Technical Disclosure Bulletin; Dynamic Software Programmable Gate Array; May 1996, vol. 39, No. 5, pp. 45–46.

*Primary Examiner*—Do Hyun Yoo

[57] ABSTRACT

A method of screening EEPROMs for data retention quality employs a UV source which is arranged to be impinged upon the devices while in wafer form, at or near an electrical probe station. Known data is stored in memory cells on an EEPROM chip while the chip is in wafer form, at a probe station. The wafer is then moved beneath a UV silo near the probe station and exposed to UV light, for a period of time and at an intensity which is sufficient to cause leakage of charge from potentially leaky floating gates. The wafer is again subjected to electrical probe where the amount of change in retained charge is detected. From this test, an indication of the charge retention ability of the devices is obtained. The UV light increases the energy state of the stored charge thus accelerating the decay of the stored charge located on the floating gates in the EEPROM device. Bits that have inherent leakage paths decay more rapidly.

17 Claims, 2 Drawing Sheets

TESTING SEMICONDUCTOR DEVICES FOR DATA RETENTION

BACKGROUND OF THE INVENTION

1. Technical Field

This invention relates to semiconductor devices, and more particularly to a method for testing programmable memory devices for data retention characteristics.

2. Description of the Related Art

Electrically-erasable, programmable read-only memory devices (EEPROMs) operate on the basis of storing charge on a floating gate. The gate is floating in that it is not connected to any other electrode or to the silicon substrate, but instead is isolated from any conducting path by silicon oxide. The ability of the floating gate to store charge without leakage determines the ability of the EEPROM device to store data over a long period of time. Preferably, an EEPROM device can store data for many years.

In a manufacturing process for devices of this type, many factors can lead to reduction of the quality of the silicon oxide used to isolate the floating gates, and thus lead to deterioration of the data storage ability over time. The devices must be tested at the end of the manufacturing process to insure that such deterioration has not occurred or is at acceptable levels so data retention is within the specifications for the devices. But since the specified data retention periods are measured in years, it is not possible to life-test the devices or even samples of the devices before delivery to customers.

The screening method ordinarily used for EEPROM devices employs a high-temperature bake. High temperature accelerates the loss of charge stored on a floating gate. Devices are subjected to bakes for periods from a few hours to a few days. The amount of charge lost from the floating gates is of course dependent on time and temperature, but the temperature cannot be higher than certain limits or the devices are destroyed. Increasing the time to a point where a reliable test is obtained is expensive in that costly and bulky equipment is required which must be tied up for long periods, and this test interrupts the flow of material in the manufacturing process. Only a sample may be tested in this way, or preferably 100% of the devices are screened using this heat treatment. And, this screening is done after the devices are packaged rather than when still in wafer form, further increasing cost.

Certain types of programmable memory devices are erased by ultraviolet light (UV). In addition to being erasable electrically, an EEPROM device could be erased by UV, and indeed EEPROMs (i.e., floating gate devices which were not electrically erasable) were erased only by UV, and had a window in the package above the chip to allow UV to impinge upon the chip. Indeed, the effect of UV on loss of charge is greater than that of heat, so a device can be totally erased in a few seconds using UV, whereas the same device might take orders of magnitude longer to become totally erased by heat.

Heretofore, testing or screening equipment for EEPROMs using UV instead of heat for forcing loss of charge has not been available.

SUMMARY OF THE INVENTION

It is therefore one object of the present invention to provide an improved method of testing semiconductor devices.

It is another object of the present invention to provide an improved method of manufacturing EEPROM devices in which screening for data retention quality is more efficient.

It is yet another object of the present invention to provide a method of screening programmable memory devices which is fast and does not require costly equipment.

The above as well as additional objects, features, and advantages of the present invention will become apparent in the following detailed written description.

According to one embodiment of the invention, a method of screening EEPROMs for data retention quality employs a UV source which is arranged to be impinged upon a wafer at or near the probe station, i.e., at the point in the manufacturing process where the devices are essentially completed, but the wafer has not been scribed and broken into individual chips. At the probe station, various electrical tests are made on the devices which are still in wafer form, by a test jig which contacts metal pads on each chip by a multiplicity of probes or pins. In one example of a test set up employing the features of the invention, a wafer is held in a wafer chuck which can be moved between a probe position and a position in a UV silo. In the probe position, a probe card engages each of the chips using pins which contact metal pads on the wafer surface. In addition to various other tests conducted at the probe position, a predetermined logic state is written into the EEPROM device. The wafer is then moved to the UV silo by the chuck, and exposed to UV light. The UV light increases the energy state of the stored charge thus accelerating the decay of the stored charge located on the floating gates in the EEPROM device. Bits that have inherent leakage paths will decay more rapidly allowing the electrical retention test to mark (record) these defective bits.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment, when read in conjunction with the accompanying drawings, wherein:

DETAILED DESCRIPTION OF PREFERRED EMBODIMENT

Figure 1:
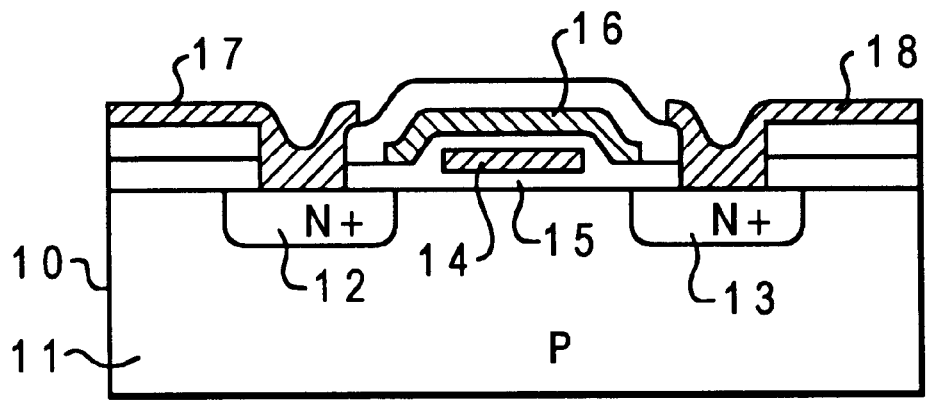
FIG. 1 is an elevation view in section of an EEPROM memory cell typical of the type of device which may use the features of one embodiment of the present invention.

Referring to FIG. 1, an EEPROM device 10 is shown which may be subjected to the retention screening of the invention. Of course, this is merely a typical device structure, and forms no part of the method of the invention. The device includes a P-type silicon substrate 11 with N+ source and drain regions 12 and 13 formed therein. A polysilicon floating gate 14 is formed over the channel between source and drain, and is isolated from the channel by gate oxide 15. A polysilicon control gate 16 overlies the floating gate 14. An erase gate (which may take various forms) is positioned near the floating gate but is isolated from it by oxide. The erase gate is electrically connected to an external electrode by some path, whereas the floating gate is totally isolated. The source and drain regions 12 and 13 are connected by metal contacts 17 and 18 to operating bias and signal connections for operation and testing.

Figure 2:
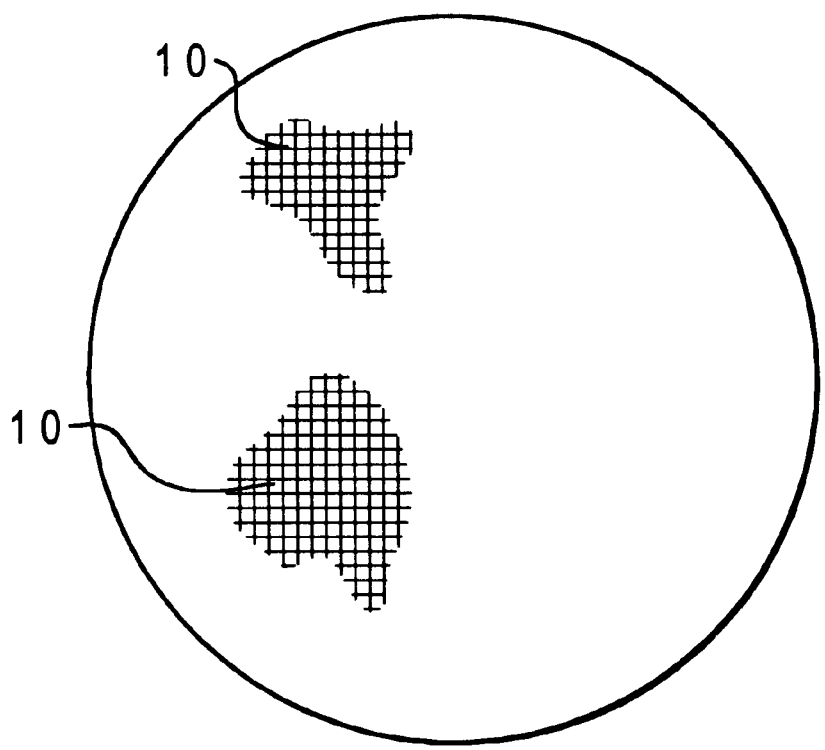
FIG. 2 is a view of EEPROM devices as in FIG. 1, in wafer form.

Only one memory cell is shown in FIG. 1 for purposes of explanation, but of course a very large number of such cells would be on a chip, e.g., 16 Meg or 32 Meg, and hundreds of chips are formed simultaneously on a wafer 20 which is shown undivided in FIG. 2. The chips 10 exist in the form shown in FIG. 2 during the NMOS or CMOS manufacturing process, and upon completion of all of the processing steps the wafer 20 is subjected to electrical probe.

Figure 3:
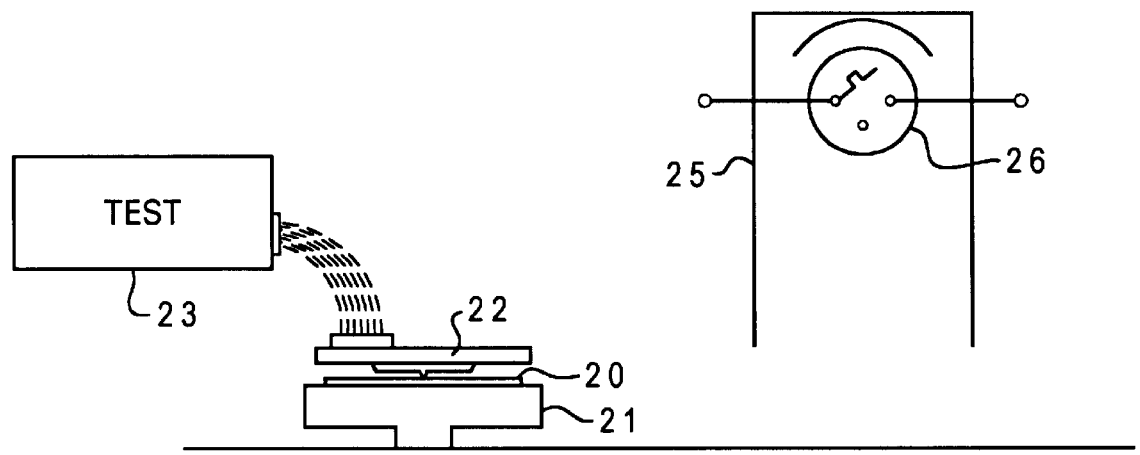
FIG. 3 is an elevation view of an electrical probe station which may be used for the retention screening of one embodiment of the invention.

Referring to FIG. 3, a wafer probe station is shown in which a wafer chuck 21 is used to support a wafer 20 and to move it into a position beneath a probe card 22. the probe card 22 is an interface between a test machine 23 and the chips 10, via very fine pins 24 which are arranged to make electrical contact to metal pads on the chip like the contacts 17 and 18. In this way operating voltages and signals (data) can be applied to the memory device for test purposes. Various tests are run by the test machine 23 for the usual production tests, but for the purposes of implementing this invention a predetermined logic state is written into the bits of the chips, i.e., the floating gates 14 are charged to a selected logic level to represent data to be stored.

Figure 4:
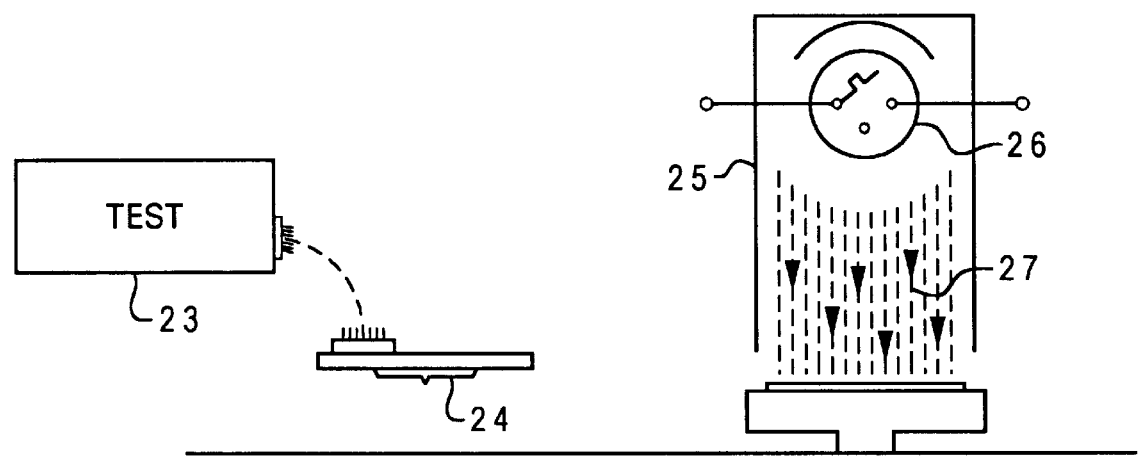
FIG. 4 is view as in FIG. 3 wherein the wafer containing the EEPROM devices is moved to a position under a UV silo.

Included in the probe station of FIG. 3, near the probe card 22, is a UV silo 25 containing a UV lamp 26, and the chuck 21 is constructed to move the wafer 20 from the position of FIG. 3 beneath the probe card 22 to a position as shown in FIG. 4 where the wafer is beneath the UV lamp 26 in the UV silo 25. When in the position of FIG. 4, the entire wafer 20 is subjected to a UV light beam 27 which is of an intensity and for a time that is selected to be less than that which would erase the floating gates, but sufficient to cause leakage to be exaggerated for devices that would leak charge over a long period measured in years. The UV light beam 27 increases the energy state of the stored charge on the floating gates 14, thus accelerating the decay of the stored charge. Bits that have inherent leakage paths will decay more rapidly. After the designated time beneath the UV light beam 27, the wafer 20 is moved back to the position of FIG. 3, beneath the probe card 22. Again the probe pins 24 engage the chips, so the test machine 23 can again apply operating voltages and determine characteristics such as threshold voltage, conductance, etc., of the chips and individual bits, i.e., individual ones of the memory cells as seen in FIG. 1, or of specially designed test structures on the chip. So the retention test, the test to determine the ability of the floating gates to retain charge, consists of:

1. Storing known data in memory cells on an EEPROM chip while the chip is in wafer form, at a probe station.
2. Exposing the wafer to UV light for a period of time and at an intensity which is sufficient to cause leakage of charge from potentially leaky floating gates; this is less than what would be needed to totally erase the data for known good devices.
3. Again subjecting the wafer to electrical probe so that the amount of change in retained charge is detected.

From this test, an indication of the charge retention ability of the devices is obtained and defective units can be isolated from the good population.

The intensity of the UV beam 27 and the length of time the wafer 20 is to be exposed to the beam are empirically determined. The structure of the memory cells of the EEPROM, as seen in FIG. 1, and the thicknesses of the various layers, as well as the composition (opaqueness and reflectivity) of the layers, will vary depending upon device design and manufacturing processes. So, the range of UV light intensity and exposure time that will function for the purposes of the invention is quite wide. To determine the proper time and intensity, batches of EEPROM devices from the same or similar manufacturing lots are run through a standard high temperature bake used for retention screening, with nominal setting for temperature and time, and the failure rate is noted. Then batches of EEPROM devices from the same lot(s) are run through UV screening using the set up of FIGS. 3 and 4, with UV intensity and exposure time at differing values, until a setting is obtained that duplicates the retention failure rate of the devices which were subjected to baking step. The UV intensity and exposure time are necessarily less than that which would erase all of the data of a known good device, i.e., remove all of the charge on the floating gates, for a given device structure made by a given process. Probably it would serve well to limit the UV light to a time and intensity that on average does not remove more than about 50% or so of the charge on floating gates, for known good devices, although there are certainly situations where the advantageous features of the invention could be obtained when almost all of the charge is removed by the UV step, for potentially leaky devices; for example, if a differential cell structure is used, one side could loose almost all of its charge and still leave the part functional.

The testing step to determine the amount of charge lost on the floating gate, after UV exposure according to the invention, is based on determining the turn-on characteristics of the device. That is, the voltage level needed on a gate 16 to overcome the influence of charge on the floating gate 14 and allow conduction at low impedance between source 12 and drain 13. The test is made by margining circuits on each chip 10 which are used in testing but not in ordinary operation of the device. These margining circuits are not part of the present invention.

Although EEPROM devices are mentioned here as the devices to be tested, it is understood that the principles of the invention can be used as well in testing or retention screening of other floating gate devices, such as EPROMs, programmable arrays, or logic devices (e.g., microprocessor or microcontroller devices) having programmable bits or cells imbedded in them.

While the invention has been shown and described with reference to a particular embodiment, it will be understood that various changes in form and detail of the preferred embodiment, as well as other embodiments of the invention, may be made by those skilled in the art without departing from the true spirit and scope of the invention.

What is claimed is:

1. A method of testing a programmable memory device for charge retention characteristics, comprising the steps of:
    applying a known charge to floating gates in said device;
    subjecting said device to UV light for a time and intensity sufficient to cause leakage of said charge from potentially leaky ones of said floating gates but not sufficient to cause total erasure of said known charge from good ones of said floating gates; and
    testing said device to determine the value of stored charge on said floating gates to thereby determine the charge leakage therefrom.

2. A method of testing a programmable memory devices according to claim 1 wherein said device is in wafer form with a large number of other such device during said steps of applying a known charge, subjecting to UV light, and testing.

3. A method according to claim 2 wherein said steps of applying a known charge and testing are at an electrical probe station, and said step of subjecting said devices to UV light is at a UV silo near said electrical probe station.

4. A method according to claim 3 wherein said steps of applying a known charge, subjecting to UV light, and testing are part of a continuous manufacturing process not interrupted by said testing.

5. A method according to claim 1 wherein said step of subjecting to UV light is for a time and intensity that on average does not remove more than about 50% of the charge on said floating gates by said leakage, for a known good device, to thereby allow prediction of the storage lifetime of the device.

6. A method according to claim 1 wherein said step of subjecting to UV light is for a time and intensity that does not erase the charge on said floating gates.

7. A method of testing a semiconductor device for charge retention characteristics, comprising the steps of:

applying a known charge to an isolated electrode in said device;

subjecting said device to UV light for a time and intensity sufficient to cause leakage of said charge from said electrode if said electrode is a potentially leaky one but not sufficient to cause total erasure of said known charge from said isolated electrode if said electrode is not potentially leaky; and testing said device to determine the value of stored charge in said isolated electrode to thereby determine the charge leakage therefrom.

8. A method of testing a semiconductor device according to claim 7 wherein said device is in wafer form during said steps of applying a known charge, subjecting to UV light, and testing.

9. A method according to claim 8 wherein said device is an EEPROM and said isolated electrode is a floating gate, and wherein said steps of applying a known charge and testing are at an electrical probe station, and said step of subjecting said device to UV light is at a UV silo near said electrical probe station.

10. A method according to claim 7 wherein said step of subjecting said device to UV light is for a time and intensity that on average does not remove more than about 50% of the charge on said electrode by said leakage, for a known good device.

11. A method according to claim 7 wherein said step of subjecting to UV light is for a time and intensity that does not erase the charge on said electrode, for a known good device, to thereby allow prediction of the storage lifetime of the device.

12. Apparatus for testing programmable memory devices for charge retention characteristics, comprising:

means for applying a known charge to floating gates in said devices;

a UV light source for subjecting said devices to UV light for a time and intensity sufficient to cause leakage of said charge from potentially leaky ones of said floating gates but not sufficient to cause total erasure of said known charge from good ones of said floating gates; and means for testing said devices to determine the value of stored charge in said floating gates to thereby determine the charge leakage therefrom and predict the storage lifetime of the devices.

13. Apparatus for testing programmable memory devices according to claim 12 wherein said devices are in wafer form.

14. Apparatus according to claim 13 wherein said means for applying a known charge and said means for testing are at an electrical probe station, and said UV light source is at a UV silo near said electrical probe station.

15. Apparatus according to claim 14 wherein said UV light source applies UV light to said devices for a time and an intensity not sufficient to cause erasure of properly-formed known good floating gates.

16. A method of testing a wafer, comprising the steps of applying a charge to an element of said wafer, and subjecting a wafer to a UV light to increase energy state of said charge on the wafer, said UV light being of an intensity to cause leakage of said charge from said element if said element is potentially leaky but not sufficient to cause total erasure of said charge from said element if said element is not potentially leaky.

17. The method of claim 16, further comprising the step of determining the energy state of said charge.

* * * * *